(12) United States Patent
Li

(10) Patent No.: US 9,028,098 B2
(45) Date of Patent: May 12, 2015

(54) LED COMPONENT, LED MODULE AND METHOD FOR MANUFACTURING THE LED COMPONENT

(71) Applicants: Lite-On Opto Technology (Changzhou) Co., Ltd., Jiangsu Province (CN); Lite-On Technology Corp., Taipei (TW)

(72) Inventor: Po-Wei Li, Taipei (TW)

(73) Assignees: Lite-On Opto Technology (Changzhou) Co., Ltd., Jiangau Province (CN); Lite-On Technology Corp., Taipei (TW)

( * ) Notice: Subject to any disclaimer, the term of this patent is extended or adjusted under 35 U.S.C. 154(b) by 0 days.

(21) Appl. No.: 14/090,312

(22) Filed: Nov. 26, 2013

(65) Prior Publication Data

US 2014/0146536 A1    May 29, 2014

(30) Foreign Application Priority Data

Nov. 29, 2012    (CN) .......................... 2012 1 0501483

(51) Int. Cl.

| | |
|---|---|
| F21V 23/00 | (2006.01) |
| H05K 3/32 | (2006.01) |
| F21K 99/00 | (2010.01) |
| H05K 1/11 | (2006.01) |
| H05K 3/40 | (2006.01) |
| F21V 3/00 | (2006.01) |
| F21Y 101/02 | (2006.01) |
| F21Y 103/02 | (2006.01) |
| F21Y 105/00 | (2006.01) |
| F21Y 111/00 | (2006.01) |
| H05K 1/18 | (2006.01) |

(52) U.S. Cl.
CPC .. *H05K 3/32* (2013.01); *F21K 9/90* (2013.01); *Y10T 29/49146* (2015.01); *Y10T 29/4913* (2015.01); *F21V 3/00* (2013.01); *F21K 9/135* (2013.01); *F21Y 2101/02* (2013.01); *F21Y 2103/022* (2013.01); *F21Y 2105/001* (2013.01); *F21Y 2111/005* (2013.01); *H05K 1/119* (2013.01); *H05K 1/181* (2013.01); *H05K 3/403* (2013.01); *H05K 2201/09027* (2013.01); *H05K 2201/10106* (2013.01)

(58) Field of Classification Search
USPC ............ 362/249.01, 249.02, 249.08, 249.04; 257/40, 98
See application file for complete search history.

(56) References Cited

U.S. PATENT DOCUMENTS

| 6,851,837 B2 * | 2/2005 | Tessnow et al. ............... 362/362 |
| 2011/0215296 A1 * | 9/2011 | Murai et al. .................... 257/13 |
| 2012/0176803 A1 * | 7/2012 | McLennan .................... 362/373 |

* cited by examiner

*Primary Examiner* — Tracie Y Green
(74) *Attorney, Agent, or Firm* — Rosenberg, Klein & Lee

(57) ABSTRACT

A light emitting diode (LED) component includes a base having a main body and a wiring pattern. The main body defines an axis and includes two connecting surfaces respectively located at two opposite sides thereof, and a plurality of interconnected mounting surfaces surrounding the axis and connected between the connecting surfaces. The wiring pattern is at least disposed on the mounting surfaces and includes electrically insulated anode and cathode. A plurality of light emitting diode (LED) chips are disposed on the mounting surfaces. Each LED chip is electrically connected to the anode and the cathode.

21 Claims, 16 Drawing Sheets

US 9,028,098 B2

LED COMPONENT, LED MODULE AND METHOD FOR MANUFACTURING THE LED COMPONENT

CROSS REFERENCE TO RELATED APPLICATION

This application claims priority of Chinese Application No. 201210501483.4, filed on Nov. 29, 2012.

BACKGROUND OF THE INVENTION

1. Field of the Invention

This invention relates to an LED component, more particularly to an LED component having wide-angle light emission by a three-dimensional packaging structure, an LED module and a method for manufacturing the LED component.

2. Description of the Related Art

Light emitting diodes (LEDs) have advantages, such as energy saving, environmental protection, and long service life, so that they have been widely used in the fields of light emission and illumination. However, in the field of illumination, a light source with a wide-angle light emission is required to expand the range of illumination. Because the light emitting angle of the LED chip has a limitation, a package structure must be used to integrate a plurality of chips so as to overcome the light emitting angle limitation of a single chip, thereby enhancing the light emitting angle of the entire illumination system.

How to make the overall structure of the package simple, easy to manufacture, and easy to install in an illumination system so as to expand the illumination region is an issue that needs to be resolved.

SUMMARY OF THE INVENTION

Therefore, an object of the present invention is to provide a light emitting diode (LED) component that has a simple structure and that has a plurality of light emitting surfaces.

Another object of this invention is to provide a stackable LED component, and a plurality of the LED components are stacked to constitute a light emitting diode (LED) module.

Still another object of this invention is to provide a method for manufacturing an LED component.

The advantage of the present invention resides in that the LED component of this invention has a three-dimensional packaging structure, and the LED chips are disposed around the base, so that the entire LED component can emit light at a large angle (360 degrees). Furthermore, a plurality of the LED components can be fixedly interconnected through the connecting shaft to form the LED module, and the LED components are electrically connected after being stacked together. Hence, there is no need for additional wiring or soldering, so that assembly is facilitated. Additionally, during manufacturing of the LED component, the rotating shaft can be used to turn the mounting surfaces of the base so as to enhance the speed and convenience of the production process.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
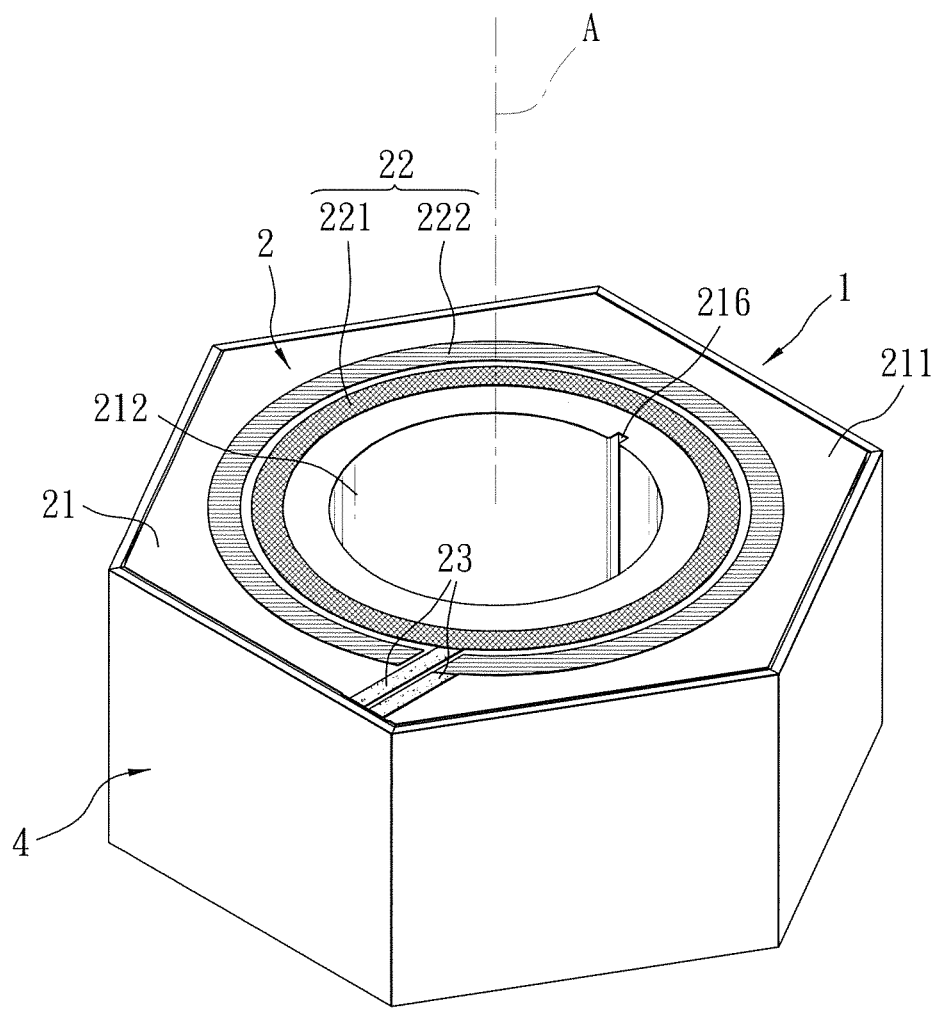
FIG. 1 is a perspective view of the preferred embodiment of an LED component according to the present invention.

The above-mentioned and other technical contents, features, and effects of this invention will be clearly presented from the following detailed description of one preferred embodiment in coordination with the reference drawings.

Before this invention is described in detail, it should be noted that, in the following description, similar elements are designated by the same reference numerals.

Referring to FIGS. 1 to 4, the preferred embodiment of a light emitting diode (LED) component 1 according to the present invention comprises a base 2, a plurality of light emitting diode (LED) chips 3 and a transparent cover 4. The base 2 has a main body 21 and a wiring pattern 22. The main body 21 is a polygonal columnar body, defines an A-axis, and includes two connecting surfaces 211 respectively located at two opposite sides thereof, an axial hole 212 extending through the connecting surfaces 211 along the A-axis, a plurality of interconnected mounting surfaces 213 that surround the A-axis and that are connected between the connecting surfaces 211, and a groove 214 annularly formed in the mounting surfaces 213 and surrounding the A-axis.

Figure 6:
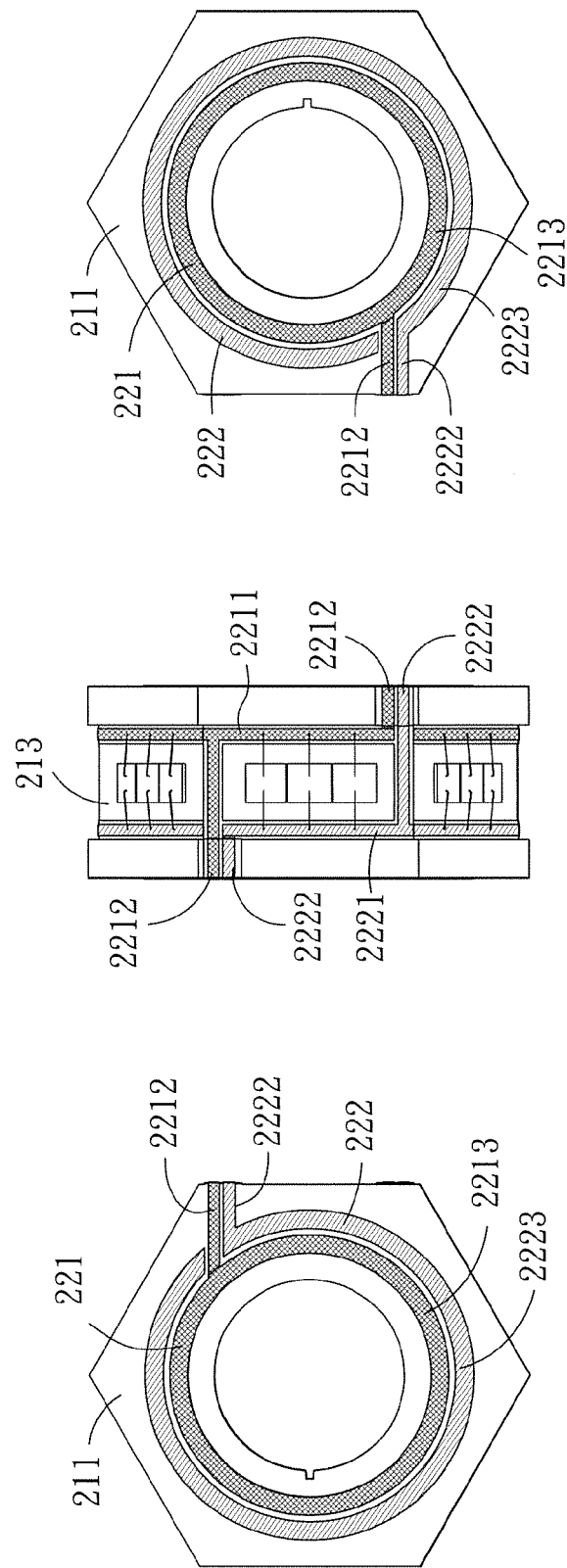
FIGS. 6A-6C illustrate bottom, side and top views of the base of the preferred embodiment.

Referring to FIGS. 6A-6C, the wiring pattern 22 is mounted and distributed on the mounting surfaces 213, and extends to at least one of the connecting surfaces 211. The wiring pattern 22 includes an anode 221 and a cathode 222 electrically insulated from each other. Specifically, each of the anode 221 and the cathode 222 includes a chip-connecting section 2211, 2221, two extensions 2212, 2222 extending from the chip-connecting section 2211, 2221 to the respective connecting surfaces 211, and two conductive sections 2213, 2223 extending from the respective extensions 2212, 2222 to locate on the respective connecting surfaces 211 and surrounding the axial hole 212. The chip-connecting sections 2211, 2221 of the anode 221 and the cathode 222 are located spaced apart from each other in the groove 214, and extend around the A-axis. Each extension 2212, 2222 of the anode 221 and the cathode 222 is disposed on both of the mounting surface 213 and the respective connecting surface 211, and is connected to and disposed between the chip-connecting section 2211, 2221 and the corresponding conductive section 2213, 2213. The extensions 2212, 2222 and the chip-connecting section 2211, 2221 of each of the anode 221 and the cathode 222 that are located on the same mounting surface 213 cooperatively form a substantially Z-shaped pattern, while the conductive sections 2213, 2223 thereof are located on the respective connecting surfaces 211 at positions corresponding to and aligning with each other. That is, the layouts of the conductive sections 2213, 2223 of each of the anode 221 and the cathode 222 are substantially the same and are spaced apart from each other along the A-axis.

Simply speaking, when the A-axis is perpendicular to a horizontal plane, the conductive sections 2213, 2223 of each of the anode 221 and the cathode 222 are stacked one above the other. Through this, when one LED component 1 is stacked on top of the other LED component 1 (see FIG. 11), each conductive section 2213, 2223 of the anode 221 and the cathode 222 of one of the LED components 1 can contact the corresponding conductive section 2213, 2223 of the anode 221 and the cathode 222 of the other LED component 1 to form an electrical connection therewith. Further, the extensions 2212, 2222 of each of the anode 221 and the cathode 222 that are located on the connecting surfaces 211 are respectively covered by insulation layers 23 to prevent contact between the conductive section 2213, 2223 of one of the LED components 1 and the extension 2212, 2222 of the other LED component 1 when the LED components 1 are interconnected, so that a short circuit phenomena can be avoided.

In this embodiment, the conductive sections 2213 and 2223 located on the same connecting surface 211 are coplanar, and are disposed concentrically on the connecting surface 211 with the A-axis serving as the center thereof. The inner ring of the conductive section 2213 is a full circle, whereas the outer ring of the conductive section 2223 is formed with a notch for passage therethrough of the extension 2212 that is to be connected with the inner ring of the conductive section 2213.

The main body 21 is hexagonal. Alternatively, the main body 21 may be triangular, rectangular, pentagonal, octagonal, etc., and is not limited to what is disclosed herein. The main body 21 may be made of metal, plastic, ceramic, or graphite, and uses a three-dimensional (3D) wiring technology to make the wiring pattern 22. If the main body 21 is made of a conductive material, there is need to introduce the insulation process.

The LED chips 3 are mounted and distributed on the mounting surfaces 213. Each of the LED chips 3 is electrically connected to the anode 221 and the cathode 222. In particular, the LED chips 3 are located in the groove 214. In this embodiment, the chip-connecting sections 2211, 2221 of the anode 221 and the cathode 222 are respectively located at two opposite sides of the LED chips 3. Each LED chip 3 is electrically connected to the chip-connecting sections 2211 and 2221 by wire bonding.

Figure 7:
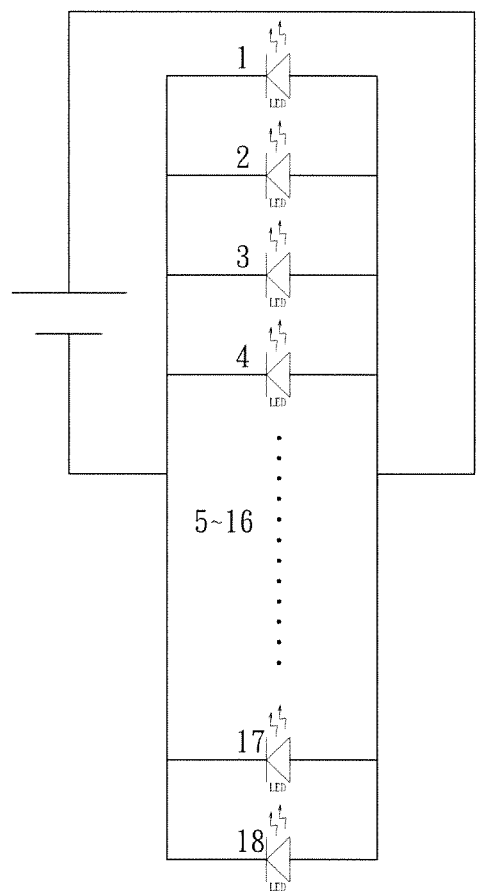
FIG. 7 is a circuit diagram, illustrating parallel connection of the LED chips of the preferred embodiment.

In this embodiment, each of the mounting surfaces 213 is provided with three LED chips 3, so that six mounting surfaces 213 have a total of 18 LED chips 3. The LED chips 3 are connected in parallel, an equivalent circuit diagram of which is illustrated in FIG. 7. Because the LED chips 3 are connected in parallel, when one of the LED chips 3 is broken and emits no light, it will not affect the other LED chips 3, so that reliability of the LED component 1 is enhanced. Surfaces of the LED chips 3 are coated with fluorescent powder (not shown) to adjust the color of light emission. The three LED chips on each mounting surface 213 are arranged in a straight line, but is not limited thereto. The arrangement and the number of the LED chips 3 can be altered according to the requirements.

Figure 2:
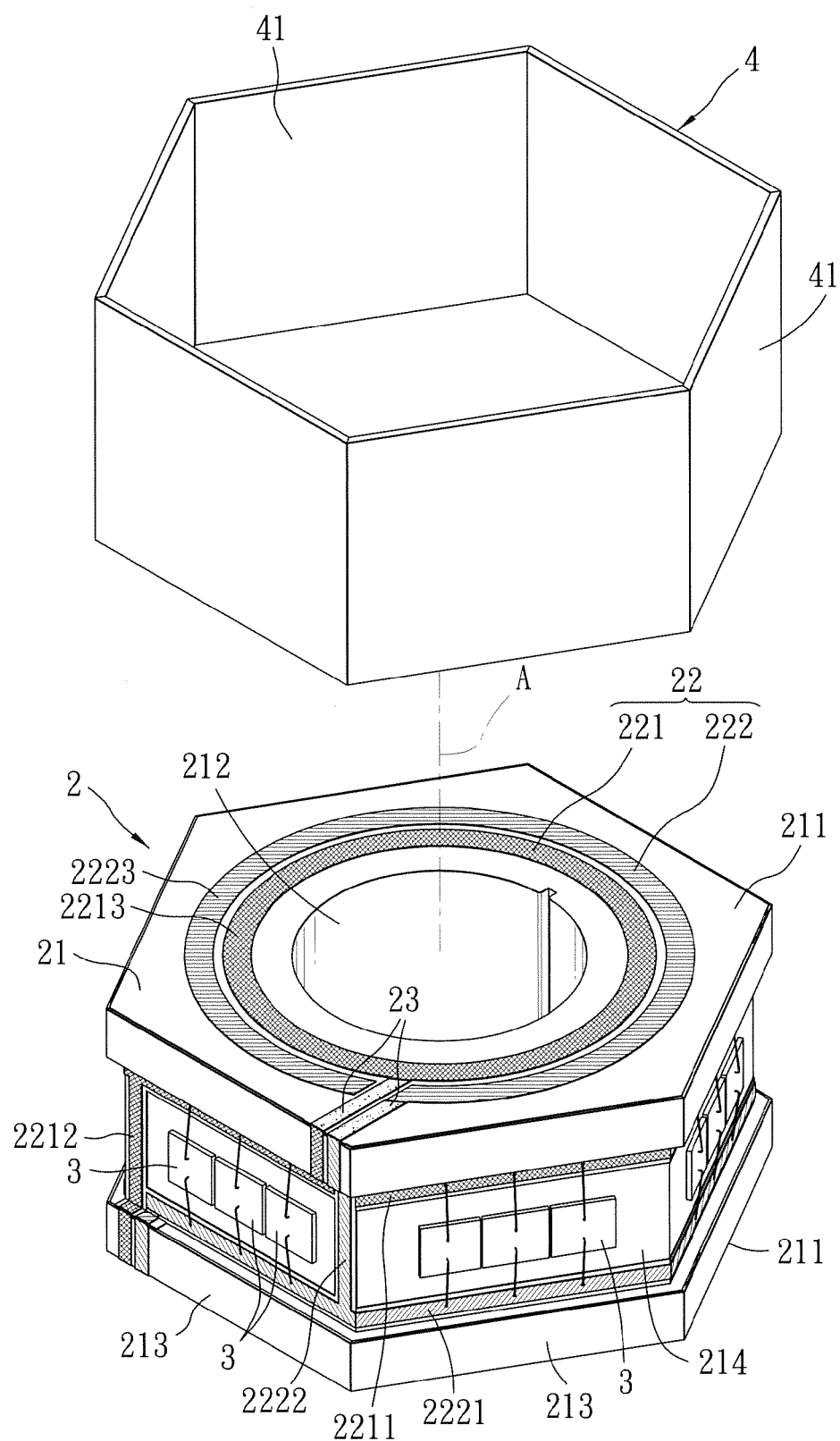
FIG. 2 is an exploded perspective view of the preferred embodiment, illustrating the relationship between a base and a plurality of LED chips.
Figure 3:
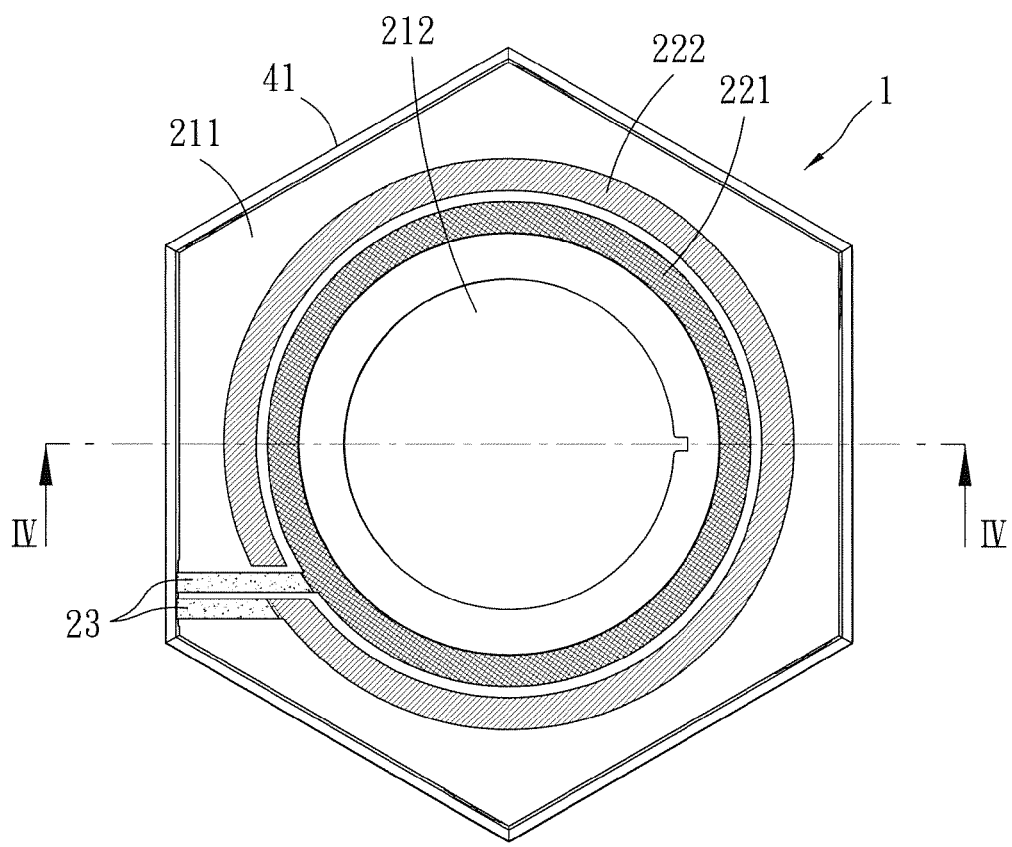
FIG. 3 is a schematic top view of the preferred embodiment.
Figure 4:
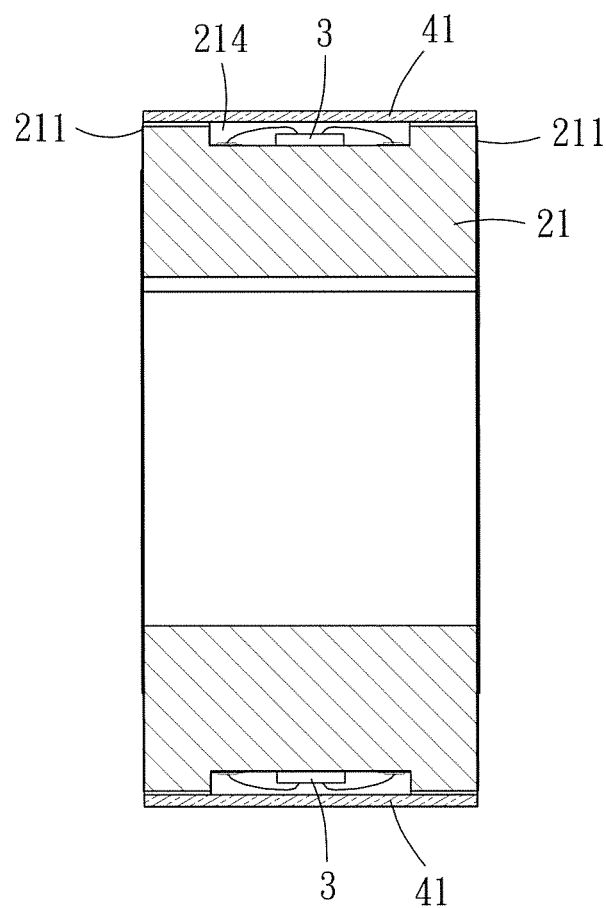
FIG. 4 is a sectional view of the preferred embodiment taken along line IV-IV of FIG. 3.
Figure 5:
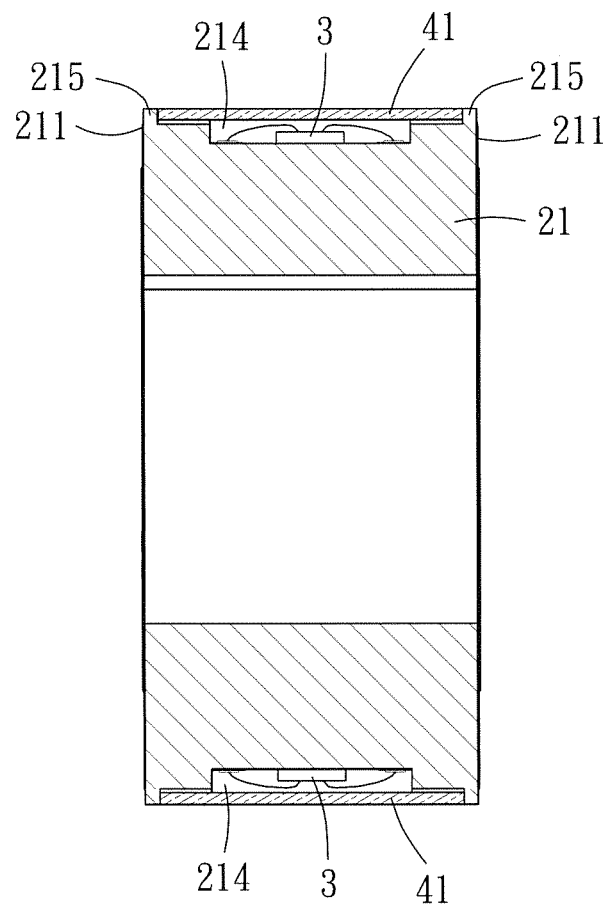
FIG. 5 is a view similar to FIG. 4, but illustrating the preferred embodiment further comprises a pair of annular limiting ribs.

With reference to FIGS. 2 and 4, the cover 4 is connected to the base 2 and covers the groove 214 and the LED chips 3. Particularly, the cover 4 includes a plurality of transparent plates 41 corresponding in number to the mounting surfaces 213. Each of the transparent plates 41 is fixed to a respective one of the mounting surfaces 213. Each transparent plate 41 can be made of an optical-grade glass or plastic, and is fixed to the respective mounting surface 213 by adhesive so as to protect the LED chips 3. The adhesive for binding the transparent plates 41 on the base 2 may include the use of double-sided tape, silicone resin, epoxy resin, or UV resin. Inner surfaces of the transparent plates 41 that are proximate to the LED chips 3 may be coated with fluorescent powder to form the phosphor plate, instead of the surfaces of the LED chips 3, to simplify the production process. Or, the fluorescent powder may be combined into the transparent plate to form a phosphor plate, it also can reach the purpose of color temperature tuning of LED. The cover 4 may also be an encapsulation resin which is disposed in the groove 214 by dispensing and which covers the LED chips 3. Through this, the LED chips 3 are encapsulated and protected. Furthermore, with reference to FIG. 5, the main body 21 further includes a pair of annular ribs 215 located and spaced apart from each other at two opposite sides of the groove 214 and proximate to the respective connecting surfaces 211 for limiting the transparent plates 41 therebetween. Through the limitation provided by the annular ribs 215 on the transparent plates 41, the transparent plates 41 can be easily positioned and stably connected to the base 2. Because each mounting surface 213 has a multi-stepped structure, an optical component (such as a lens) can also be installed thereon instead of the flat transparent plate 41 to change the shape of light emission.

Since the LED chips 3 are mounted and distributed on the mounting surfaces 213, i.e., around the base 2, a three-dimensional package structure is formed that can emit light around the base 2 at a large angle (360 degrees).

Figure 8:
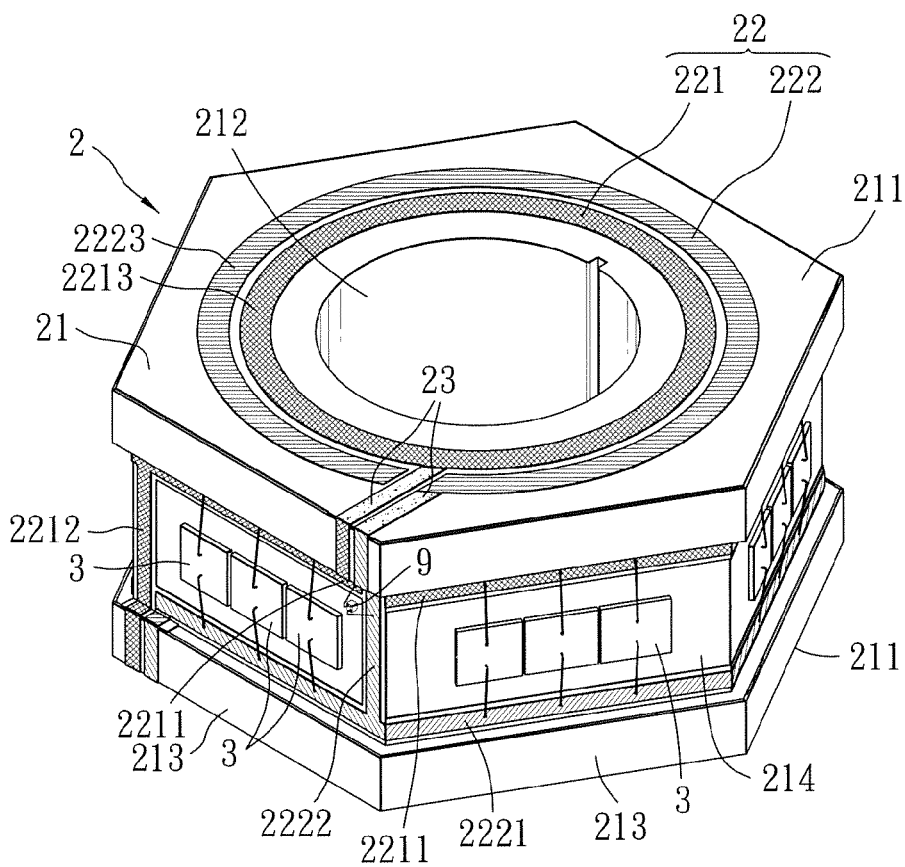
FIG. 8 is a perspective view, illustrating the preferred embodiment being further provided with a Zener diode.
Figure 9:
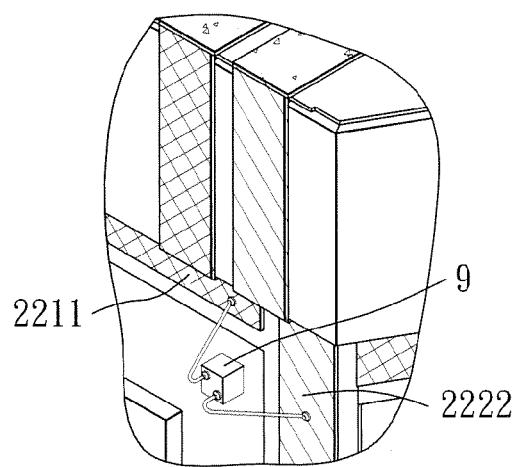
FIG. 9 is a fragmentary enlarged perspective view of FIG. 8.

Referring to FIGS. 8 and 9, the LED component 1 can be further provided with a Zener diode 9 that is electrically connected to the anode 221 and the cathode 222 for regulating the voltage to thereby protect the LED chips 3.

Figure 10C:
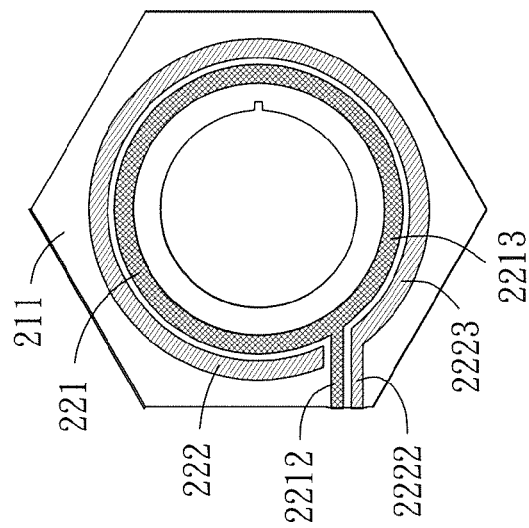
FIG. 10A-10C illustrate bottom, side and top views of an alternative form of the base of the preferred embodiment.
Figure 10B:
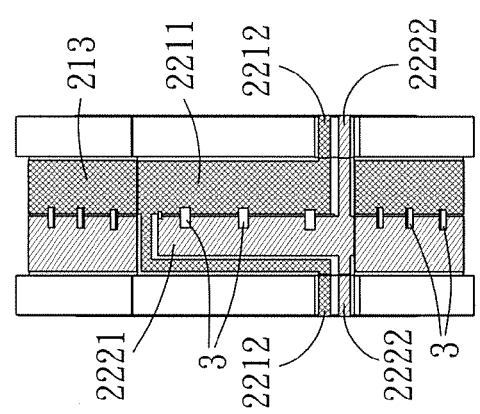
Figure 10A:
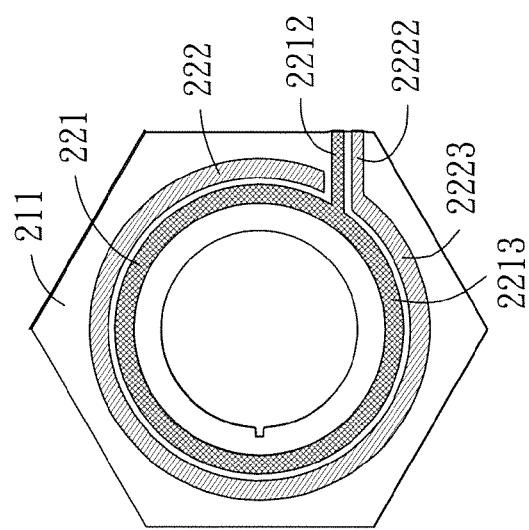

FIG. 10 illustrates an alternative form of the wiring pattern 22 for disposing the LED chips 3 in a flip chip manner. In this case, the chip-connecting sections 2211, 2221 of the anode 221 and the cathode 222 are closer to each other, so that the LED chips 3 can directly cross over (cover) the chip-connecting sections 2211 and 2221. Furthermore, the extensions 2212, 2222 of each of the anode 221 and the cathode 222 that are located on the connecting surfaces 211 correspond to each other in position and are aligned with each other along the A-axis. That is, when the A-axis is perpendicular to the horizontal plane, the extensions 2212, 2222 on the connecting surfaces 211 are stacked one above the other, and the conductive sections 2213, 2223 are also stacked one above the other.

As such, when one LED component 1 is stacked on top of the other LED component 1, only the extensions 2212, 2222 of the two LED components 1 need to correspond in position with each other to avoid short circuit, and there is no need to provide insulation layers over the extensions 2212, 2222 on the connecting surfaces 211. Especially, when only two of the LED components 1 are stacked with each other, the adjacent connecting surfaces 211 between the two components 1 are distributed with the corresponding wiring patterns 22 for electrical connection.

As shown in FIG. 10, the chip-connecting section 2211 of the anode 221 has a substantially U-shaped conductive pattern on one of the mounting surfaces 213, whereas the chip-connecting section 2221 of the cathode 222 has a substantially T-shaped conductive pattern. A concave portion formed by the U-shaped conductive pattern provides extension of a protruding portion of the T-shaped conductive pattern therein, so that the LED chips 3 can directly cross over the chip-connecting sections 2211 and 2221. It should be noted that an area of the chip-connecting section 2211 with the U-shaped conductive pattern is larger than that of the chip-connecting section 2221 with the T-shaped conductive pattern.

Figure 11:
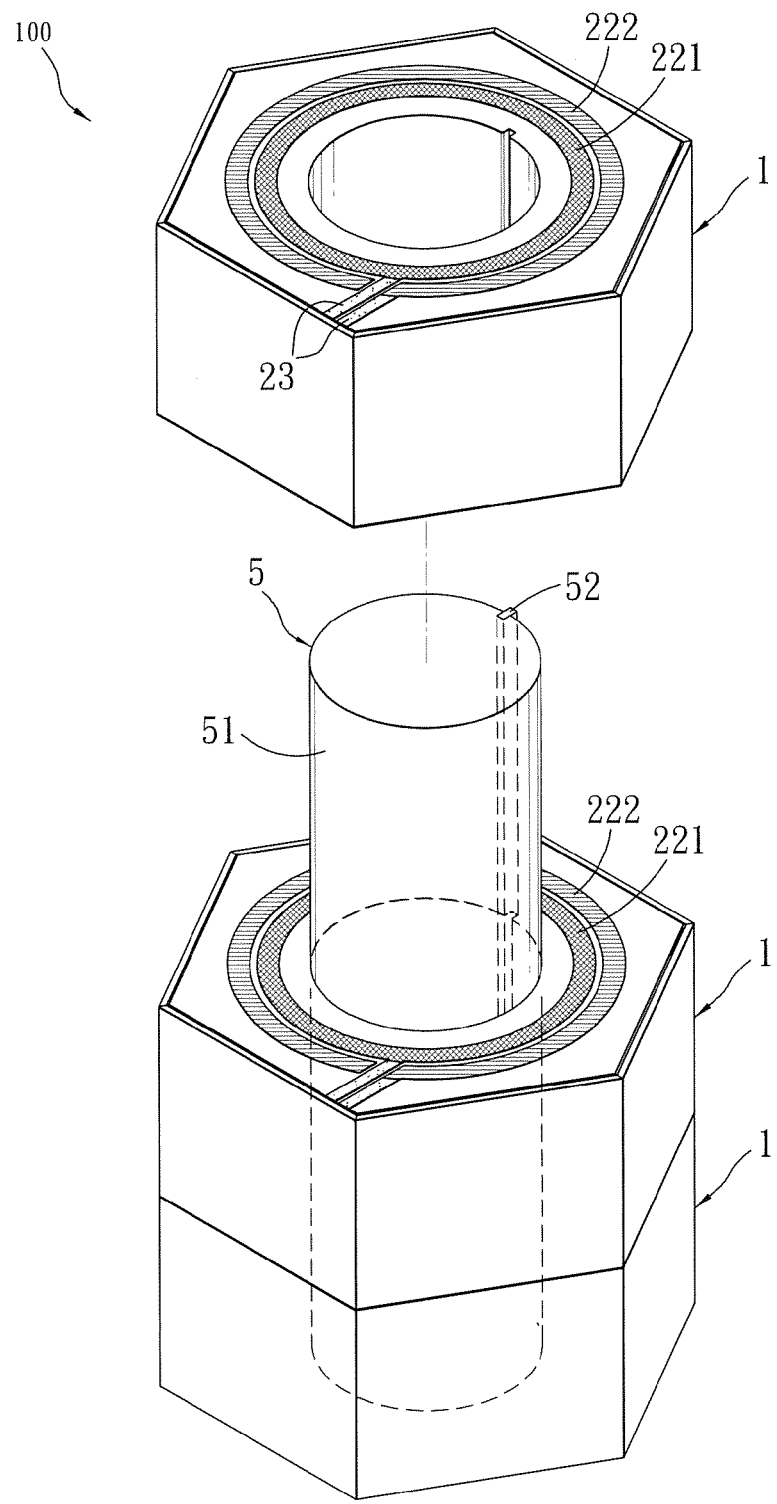
FIG. 11 is a partly exploded perspective view of an LED module according to the preferred embodiment of the present invention.
Figure 12:
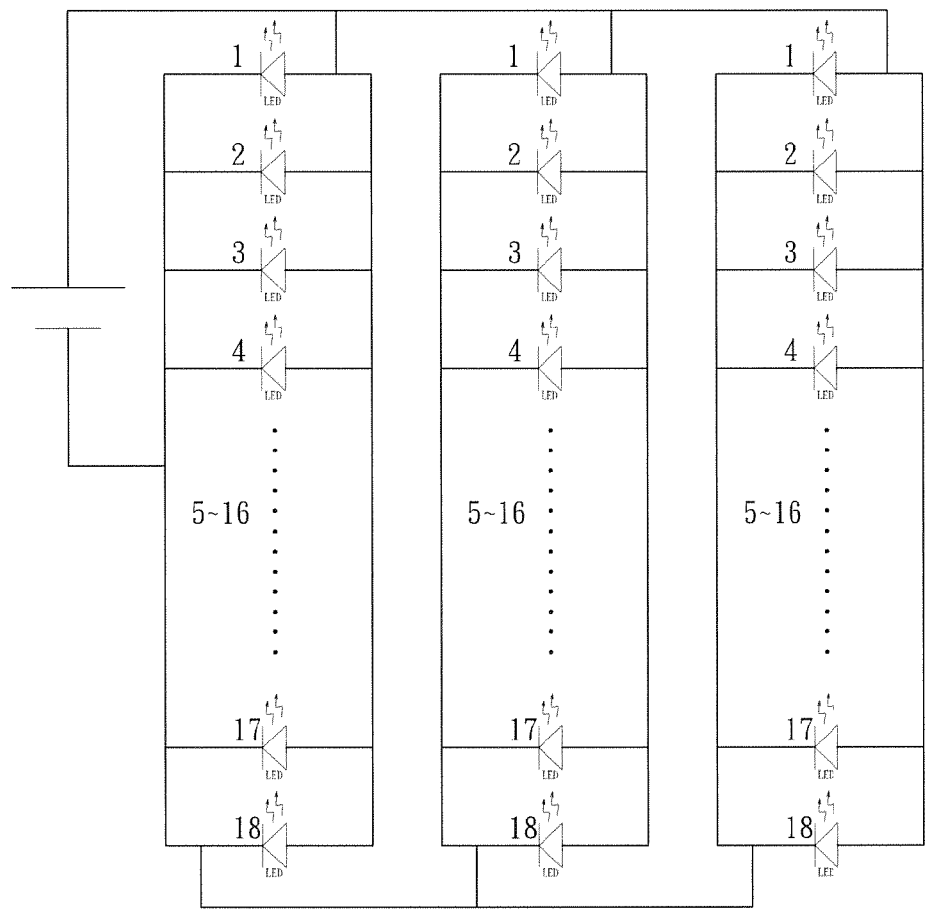
FIG. 12 is a circuit diagram, illustrating parallel connection of the LED chips of the LED module.

Referring to FIG. 11, in combination with FIG. 1, a plurality of the LED components 1 are fixedly interconnected by a connecting shaft 5 to form an LED module 100. Specifically, the connecting shaft 5 extends through the axial holes 212 in the bases 2 of the LED components 1 to fixedly interconnect the LED components 1. Each two adjacent ones of the LED components 1 are electrically connected through mutual contact of the wiring patterns 22 thereof that are located on the corresponding connecting surfaces 211. That is, the anode 221 and the cathode 222 on the connecting surface 211 of one of the LED components 1 are respectively in contact with the anode 221 and the cathode 222 on the corresponding connecting surface 211 of the adjacent LED component 1, thereby forming an electrical connection therewith. Through the presence of the wiring pattern 22 on each connecting surface 211, when the LED components 1 are stacked together, there is no need to provide additional wires for electrical connection of the LED components 1, and there is also no need for soldering, so that assembly is simple. Taking three LED components 1 that are stacked one above the other as an example, the LED chips 3 of the LED module 100 are connected in parallel, an equivalent circuit diagram of which is illustrated in FIG. 12. However, it is not limited thereto. The LED chips 3 may also be connected in series. For example, the LED chips 3 are first connected in series, wire of first one and wire of last one of LED chips 3 are then respectively connected to the chip-connecting sections 2211, 2221, so as to reach a serial connection.

Figure 13:
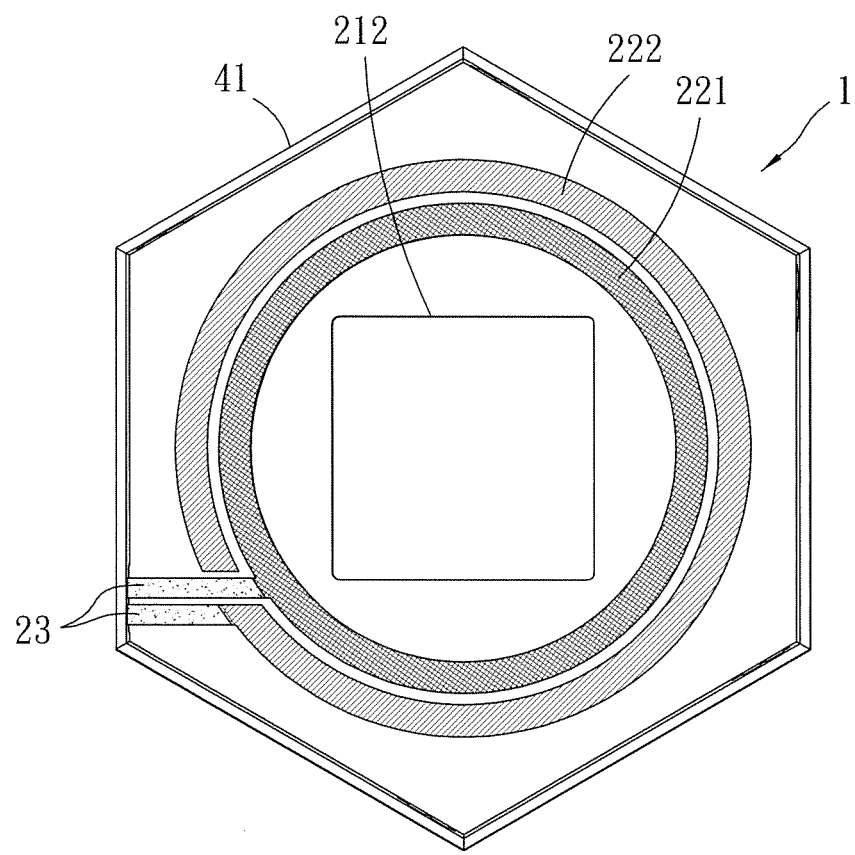
FIG. 13 is a view similar to FIG. 3, but illustrating an axial hole of the LED component being non-circular.
Figure 14:
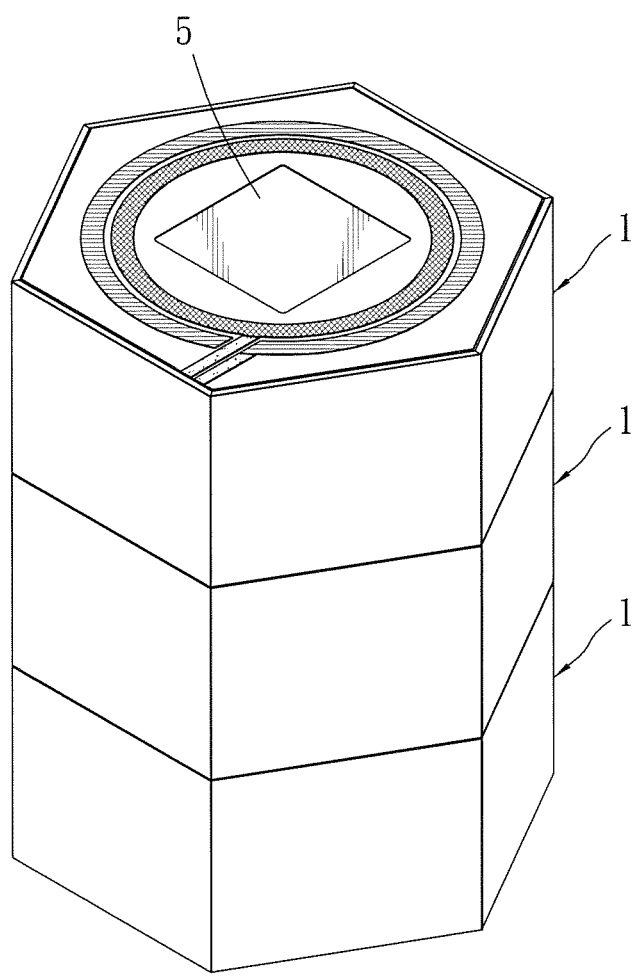
FIG. 14 is an assembled perspective view of the LED module of the preferred embodiment, but with a non-circular connecting shaft.

In this embodiment, the axial hole 212 in each LED component 1 is circular, and the main body 21 further includes an axially extending positioning groove 216 (see FIG. 1) adjacent to and communicating with the axial hole 212. The connecting shaft 5 includes a shaft body 51 having a shape matching that of the axial hole 212, and an axially extending protruding rib 52 projecting from the shaft body and engaged with the positioning grooves 216 in the main bodies 21 of the LED components 1. Through this, the LED components 1 can be positioned relative to each other. Since the extensions 2212, 2222 on the two connecting surfaces 211 of each LED component 1 are align (see FIG. 10), contact between the extensions 2212, 2222 on the connecting surfaces 211 of the two adjacent LED components 1 can be ensured, and no short circuit phenomena will occur even without being covered by the insulation layers 23. Moreover, referring to FIGS. 13 and 14, the axial hole 212 in each LED component 1 may be non-circular, and an outer periphery of the connecting shaft 5 may have a shape matching that of the axial hole 212. Hence, the shape of the axial hole 212 is not limited to what is disclosed herein.

Figure 15:
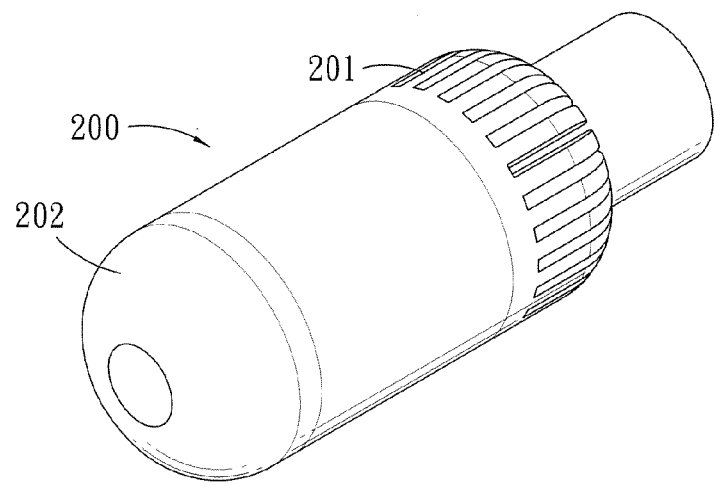
FIG. 15 is a perspective view of a lamp incorporating the LED module of the preferred embodiment.
Figure 16:
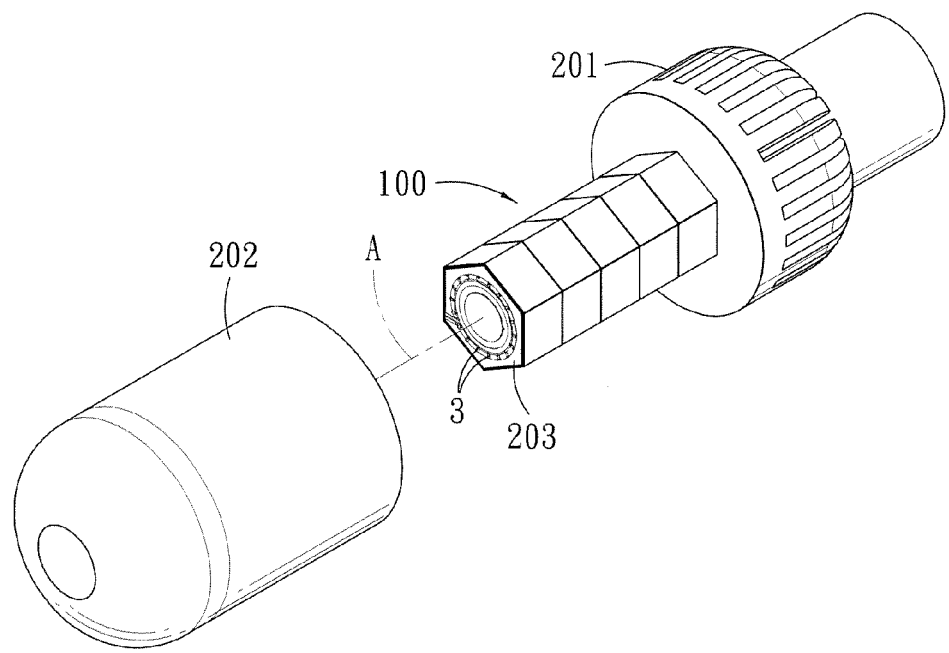
FIG. 16 is an exploded perspective of the lamp.
Figure 17:
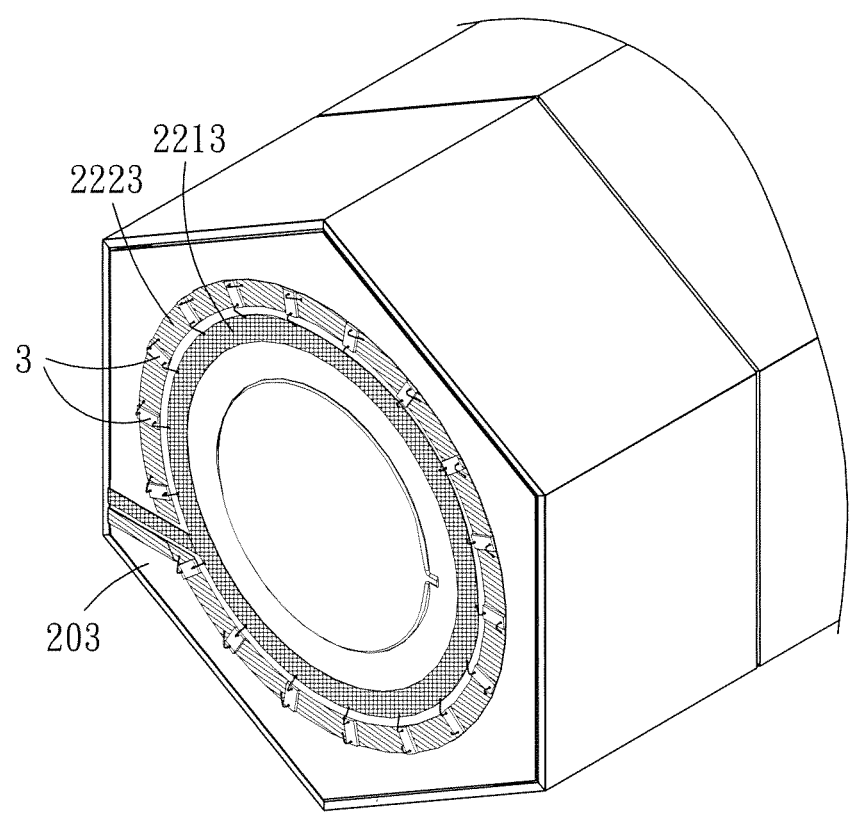
FIG. 17 is a fragmentary enlarged perspective view of FIG. 16, illustrating a top surface of the LED module being provided with a plurality of LED chips.

Referring to FIGS. 15 to 17, the LED module 100 is incorporated in a lamp 200. The LED module 100 is fixedly installed to a lamp holder 201, and is covered by a transparent lampshade 202. A bottom surface (not labeled) of the LED module 100 is connected to the lamp holder 201. The bottom surface of the LED module 100 is the connecting surface 211 of the LED component 1 that is adjacent to the lamp holder 201. The LED module 100 is electrically connected to the lamp holder 201 through the wiring pattern 22 on the connecting surface 211. A top surface 203 of the LED module 100 is the exposed connecting surface 211 of the LED component 1 that is distal from the lamp holder 201, and can be further provided with a plurality of LED chips 3. The LED chips 3 are disposed spaced apart along the conductive sections 2213, 2223. Each LED chip 3 is electrically connected to the conductive sections 2213, 2223. Taking FIG. 17 as an example, the LED chips 3 are directly fixed to the conductive section 2223, and are electrically connected to the conductive section 2213 by wire bonding. However, it is not limited thereto. The LED chips 3 may be electrically connected to the conductive sections 2213, 2223 in a flip chip manner. That is, the n-pad and p-pad of the chip are in electrical contact with the conductive sections 2213, 2223, respectively. With the LED chips 3 surrounding the A-axis and distributed on the top surface 203 of the LED module 100, the amount of light emission on top side of the lamp 200 can be enhanced. A light bulb is exemplified in this embodiment, but is not limited thereto. As long as the LED components 1 can be stacked to form a columnar light, such as a tube luminaire or a light bar, all fall within the protection scope of the present invention.

Figure 18:
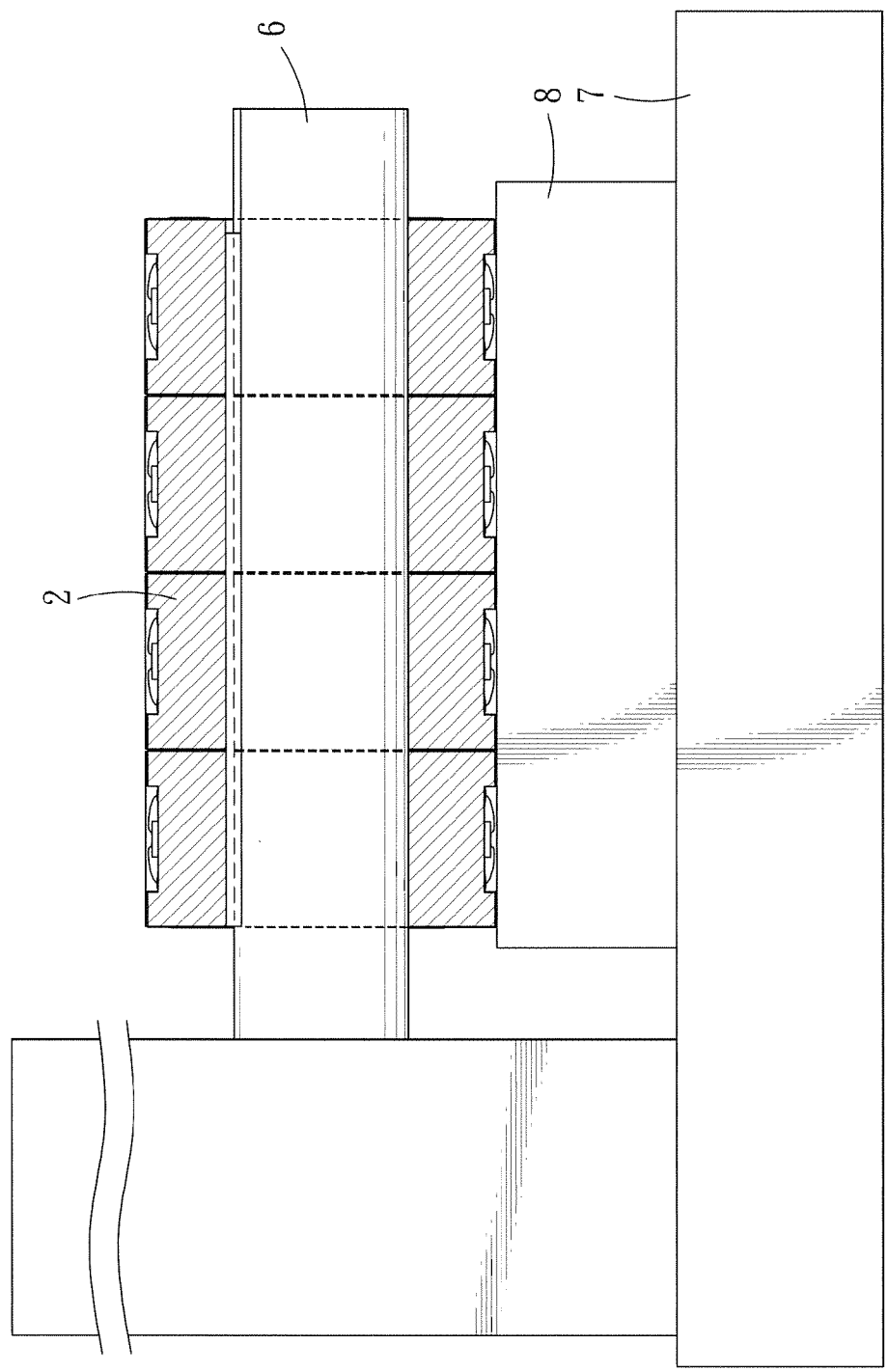
FIG. 18 is a schematic diagram, illustrating a method for manufacturing an LED component according to the preferred embodiment of the present invention.

Referring to FIG. 18, in manufacturing the LED component 1, the structural characteristics of the base 2 with the axial hole 212 is utilized, and a rotating shaft 6 is inserted into the axial hole 212 to drive rotation of the base 2, so that each mounting surface 213 of the base 2 can take turn rotating to a position that faces upward. Production processes, such as chip mounting, wire bonding, spray coating of fluorescent powder (not shown), and installing of each transparent plate 41 (see FIGS. 4 and 5) can be accomplished when each mounting surface 213 is an upwardly facing position, so that the LED chips 3 can be fixed to each mounting surface 213. Especially, when using the flip-chip type LED to manufacture the LED component 1, the process of wire bonding can be ignored. That is, the processes of mounting and electrically connecting can be implemented by one process through the flip chip method. Therefore, the method for manufacturing the LED component 1 is not limited to wiring type LED, it also comprises the flip-chip type LED therein.

Concretely speaking, during manufacturing of the LED component 1, the rotating shaft 6 is used to connect together a plurality of the bases 2 of the LED components 1 to proceed with a series of steps for LED packaging. Unlike the existing LED packaging process in which a carrier of the LED chips 3 can only be moved in a two-dimensional plane, the base 2 of this embodiment, apart from being able to move in a two-dimensional plane through a mobile platform 7, can also rotate through the rotating shaft 6 and move up and down in a perpendicular direction. In the mobile platform 7, there is provided a heater 8 to heat the base 2. The heating temperature of the heater 8 ranges from 100 to 150° C. By using the rotating shaft 6 to turn each mounting surface 213 of the base 2 so that each mounting surface 213 can take turn to face upward, the LED chips 3 can be mounted to the mounting surface 213 that faces upward, can be electrically connected to the wiring pattern 22 (see FIG. 1) of the base 2, and can be spray coated with florescent powder. Further, each transparent plate 41 can be installed on the respective mounting surface. After electrical connection of the LED chips 3, a conformal coating is applied on the LED chips 3 to form a fluorescent layer (not shown), or a fluorescent layer may first be coated on the transparent plate 41, after which the transparent plate 41 is connected to the mounting surface 213 so as to cover the LED chips 3. As such, the LED chips 3 can emit a white light by passing through the fluorescent layer. When the mounting surface 213 fixed with the LED chips 3 is turned to face downward, since the LED chips 3 are located in the groove 214, the LED chips 3 will not contact the heater 8 and can be prevented from being damaged. But the portions of the main body 21 at the two sides of the groove 214 can contact the heater 8 for conducting heat, as shown in FIG. 18.

A conventional chip-mounting method includes epoxy die bonding and eutectic die bonding. When the epoxy die bonding is used, the maximum temperature of chip mounting is about 225° C. When the eutectic die bonding is used, the maximum temperature of chip mounting is about 298° C. The present invention uses a low-temperature chip-mounting technology, the chip-mounting temperature of which is not greater than 100° C., and the chip-mounting material can endure a temperature greater than 250° C. Through this, the speed of solidification of the chip-mounting material can be accelerated to prevent flowing of the chip-mounting material during rotation of the base 2.

Additionally, if the shape of the axial hole 212 is non-circular, the rotating shaft 6 has a shape matching that of the axial hole 212 so as to easily rotate the base 2. If the axial hole 212 is circular and the base 2 has a positioning groove 216, the rotating shaft 6 may be similar in structure to the connecting shaft 5 shown in FIG. 11, which has a protruding rib (see FIG. 11). Through mutual engagement of the protruding rib and the positioning groove 216, the force acted on the base 2 by the rotating shaft 6 for rotating the same can be enhanced, and alignment and fixing of the base 2 during rotation of the base 2 can be facilitated, thereby preventing the base 2 from excessive rotation and vibration.

In summary, the LED component 1 of this invention has a three-dimensional packaging structure, and the LED chips 3 are disposed around the base 2, so that the entire LED component 1 can emit light at a large view angle (360 degrees). Furthermore, a plurality of the LED components 1 can be fixedly interconnected through the connecting shaft 5 to form the LED module 100, and the LED components 1 are electrically connected after being stacked together. Hence, there is no need for additional wiring or soldering between adjacent LED components 1, so that assembly is facilitated. Additionally, during the LED packaging, the rotating shaft 6 can be used to turn the mounting surfaces 213 so as to enhance the speed and convenience of the production process.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A light emitting diode (LED) component, comprising: a base having a main body and a wiring pattern, said main body being a polygonal columnar body, defining an axis, and including two connecting surfaces respectively located at two opposite sides of said main body, and a plurality of interconnected mounting surfaces surrounding said axis and connected between said connecting surfaces, said wiring pattern being at least disposed on said mounting surfaces and including an anode and a cathode electrically insulated from each other; and a plurality of light emitting diode (LED) chips disposed on said mounting surfaces, each of said LED chips being electrically connected to said anode and said cathode.

2. The LED component as claimed in claim 1, wherein said main body further includes a groove annularly formed in said mounting surfaces, and said light emitting diode chips are located in said groove.

3. The LED component as claimed in claim 2, wherein each of said anode and said cathode includes a chip-connecting section for electrical connection with said LED chips, said chip-connecting sections of said anode and said cathode being located spaced apart from each other in said groove and extending around said axis.

4. The LED component as claimed in claim 1, further comprising a transparent cover connected to said base and covering said LED chips.

5. The LED component as claimed in claim 4, wherein said cover includes a plurality of transparent plates corresponding in number to said mounting surfaces, each of said transparent plates being fixed to a respective one of said mounting surfaces.

6. The LED component as claimed in claim 5, wherein said main body includes a pair of annular limiting ribs located spaced apart from each other at two opposite sides of said groove and respectively proximate to said connecting surfaces, said transparent plates being limited between said pair of said annular limiting ribs.

7. The LED component as claimed in claim 1, wherein said LED chips are further disposed on at least one of said connecting surfaces, each of said LED chips being electrically connected to said anode and said cathode.

8. An LED module comprising:
a plurality of LED components, each including a base having a main body and a wiring pattern,
said main body being a polygonal columnar body, defining an axis, and including two connecting surfaces respectively located at two opposite sides of said main body, and a plurality of interconnected mounting surfaces surrounding said axis and connected between said connecting surfaces, said wiring pattern being disposed on said mounting surfaces and extending to at least one of said connecting surfaces, said wiring pattern including an anode and a cathode electrically insulated from each other, and
a plurality of light emitting diode (LED) chips disposed on said mounting surfaces, each of said LED chips being electrically connected to said anode and said cathode;
wherein each two adjacent ones of said LED components being electrically connected through said wiring patterns that are located on corresponding said connecting surfaces.

9. The LED module as claimed in claim 8, wherein said base of each of said LED components further has an axial hole extending through said connecting surfaces along said axis, said LED module further comprising a connecting shaft extending through said axial holes of said bases of said LED components for fixedly interconnecting said LED components.

10. The LED module as claimed in claim 9, wherein said axial hole is circular, said main body further including an axially extending positioning groove adjacent to and communicating with said axial hole, said connecting shaft including a shaft body having a shape matching that of said axial hole, and an axially extending protruding rib projecting from said shaft body and engaged with said positioning grooves of said main bodies of said LED components.

11. The LED module as claimed in claim 9, wherein said axial hole is non-circular, and said connecting shaft has a shape matching that of said axial hole.

12. The LED module as claimed in claim 8, wherein each of said anode and said cathode includes a chip-connecting section, two extensions and two conductive sections, said chip-connecting sections of said anode and said cathode being located spaced apart from each other in said mounting surfaces and extending around said axis, said extensions of each of said anode and said cathode extending from said chip-connecting section to respective said connecting surfaces, said conductive sections of each of said anode and said cathode respectively extending from said extensions to locate on said respective connecting surfaces at positions corresponding to and aligning with each other and surrounding said axial hole.

13. The LED module as claimed in claim 12, wherein said extensions of each of said anode and said cathode that are located on said connecting surfaces correspond to each other in position and are aligned with each other along said axis.

14. The LED module as claimed in claim 12, wherein said extensions of each of said anode and said cathode that are located on said connecting surfaces are covered by insulation layers, respectively.

15. The LED module as claimed in claim 8, wherein each of said LED components further includes a transparent cover connected to said base and covering said LED chips.

16. A method for manufacturing an LED component, comprising:

providing a base having a polygonal columnar body, an axial hole, and a plurality of mounting surfaces on an outer periphery thereof;

inserting a rotating shaft into said axial hole to drive rotation of said base such that each of said mounting surfaces is rotated to a position which faces upward;

mounting at least one LED chip on said mounting surface which faces upward; and electrically connecting said LED chip to a wiring pattern of said base.

17. The method as claimed in claim 16, further comprising the step of using a three-dimensional (3D) wiring technology to form said wiring pattern of said base, said wiring pattern being disposed on said mounting surfaces and including an anode and a cathode electrically insulated from each other.

18. The method as claimed in claim 16, wherein, after the step of electrical connection of said LED chip, further comprising the step of applying a conformal coating on said LED chip to form a fluorescent layer, so that said LED chip emits light by passing through said fluorescent layer.

19. The method as claimed in claim 16, wherein, after the step of electrical connection of said LED chip, further comprising the step of disposing a transparent cover on said mounting surface to encapsulate said LED chip.

20. The method as claimed in claim 19, further comprising the step of disposing a fluorescent material into/onto said transparent cover to form a phosphor plate, so that said LED chip emits light by passing through said phosphor plate.

21. The method as claimed in claim 16, further comprising the step of using a low-temperature chip mounting technology to mount said LED chip to said mounting surface, where operating temperature of said low-temperature chip mounting technology is not greater than 100° C.

* * * * *